(12) United States Patent
Matsunaga

(10) Patent No.: US 9,859,476 B2
(45) Date of Patent: Jan. 2, 2018

(54) LED PRODUCTION METHOD AND LEDS

(71) Applicant: MTEK-SMART CORPORATION, Kanagawa (JP)

(72) Inventor: Masafumi Matsunaga, Kanagawa (JP)

(73) Assignee: MTEK-SMART CORPORATION, Kanagawa (JP)

( * ) Notice: Subject to any disclaimer, the term of this patent is extended or adjusted under 35 U.S.C. 154(b) by 0 days.

(21) Appl. No.: 15/324,826

(22) PCT Filed: Jul. 25, 2014

(86) PCT No.: PCT/JP2014/069730
§ 371 (c)(1),
(2) Date: Jan. 9, 2017

(87) PCT Pub. No.: WO2016/006120
PCT Pub. Date: Jan. 14, 2016

(65) Prior Publication Data
US 2017/0207371 A1    Jul. 20, 2017

(30) Foreign Application Priority Data
Jul. 10, 2014   (JP) .................................. 2014-142443

(51) Int. Cl.
*H01L 33/50* (2010.01)
*H01L 33/62* (2010.01)
(Continued)

(52) U.S. Cl.
CPC .......... *H01L 33/504* (2013.01); *H01L 33/005* (2013.01); *H01L 33/507* (2013.01);
(Continued)

(58) Field of Classification Search
CPC . H01L 33/005; H01L 33/0095; H01L 33/504; H01L 33/507; H01L 33/508; H01L 33/54
(Continued)

(56) References Cited

U.S. PATENT DOCUMENTS

| 6,576,488 B2 | 6/2003 | Collins, III et al. |
| 8,058,088 B2 | 11/2011 | Cannon et al. |

(Continued)

FOREIGN PATENT DOCUMENTS

| JP | 2004-179644 A | 6/2004 |
| JP | 2005-123560 A | 5/2005 |

(Continued)

OTHER PUBLICATIONS

International Search Report dated Oct. 14, 2014 in corresponding Application No. PCT/JP2014/069730; 2 pgs.
(Continued)

*Primary Examiner* — Robert Bachner
*Assistant Examiner* — Molly Reida
(74) *Attorney, Agent, or Firm* — Maier & Maier, PLLC

(57) ABSTRACT

Provided is an LED production method that can produce a great number of high-quality LEDs at low production cost. A binder-rich layer is formed on LEDs to increase the adhesiveness between the LEDs and a substrate; a phosphor layer or phosphor-rich layer is formed over the layer with a mask put on the layer; and the phosphor or a mixture of the phosphor and binder on the mask is recovered and reused.

10 Claims, 9 Drawing Sheets

(51) Int. Cl.
  *H01L 33/60* (2010.01)
  *H01L 33/00* (2010.01)
(52) U.S. Cl.
  CPC .............. *H01L 33/60* (2013.01); *H01L 33/62* (2013.01); *H01L 2933/0041* (2013.01); *H01L 2933/0058* (2013.01); *H01L 2933/0066* (2013.01)
(58) Field of Classification Search
  USPC .......................... 438/26–28, 29; 257/98–100
  See application file for complete search history.

(56) References Cited

U.S. PATENT DOCUMENTS

| | | | |
|---|---|---|---|
| 2009/0057690 A1* | 3/2009 | Chakraborty | H01L 33/44 257/88 |
| 2010/0155763 A1 | 6/2010 | Donofrio et al. | |
| 2010/0237775 A1 | 9/2010 | Chao | |
| 2012/0032220 A1 | 2/2012 | Cannon et al. | |
| 2012/0288973 A1 | 11/2012 | Matsunaga | |
| 2013/0193465 A1* | 8/2013 | Xu | H01L 33/504 257/98 |
| 2013/0292710 A1* | 11/2013 | Kim | H01L 33/50 257/88 |
| 2014/0342480 A1 | 11/2014 | Matsunaga | |
| 2015/0111313 A1 | 4/2015 | Matsunaga | |

FOREIGN PATENT DOCUMENTS

| | | |
|---|---|---|
| JP | 2010-226110 A | 10/2010 |
| JP | 2013-197259 A | 9/2013 |
| WO | 2011/083841 A1 | 7/2011 |
| WO | 2013/038953 A1 | 3/2013 |

OTHER PUBLICATIONS

Website of Musashi Engineering, Inc., "http://www.musashi-engineering.co.jp/case/case_033_00005.html", Published: Jan. 6, 2017.

Website of Tomita engineering Co.,Ltd., "http://www.tomitaeng.co.jp/", Published: Jan. 6, 2017.

* cited by examiner

LED PRODUCTION METHOD AND LEDS

TECHNICAL FIELD

The present invention relates to an LED production method involving applying a phosphor to LEDs, and produced LEDs. In particular, the present invention relates to a method including filling or applying a slurry containing a resin, a solution, and a phosphor, or the like to peripheries of LEDs with a mask or the like and drying/curing the slurry and further relates to a method for producing white LEDs. In the present specification, a term "LED members" refers to members or the like serving as intermediate components in the middle of producing LEDs serving as finished products. Applying methods of the present invention includes, but not limited to, continuous or intermittent dispensing, inkjet, micro curtain applying, slot nozzle applying, screen printing, atomization, electrostatic atomization, and spraying.

BACKGROUND ART

A conventional white LED production method includes dispensing a slurry obtained by mixing a combination of R, G, B phosphors, at least one of YAG and TAG, a phosphor such as a silica-based phosphor, and R/G phosphors for increasing color rendering properties and a binder such as a two-pack type thermosetting silicone, to a near ultraviolet light-emitting diode or blue light-emitting diode using a dispenser. Another white LED production method includes coating LEDs by adding a solvent or the like to the above slurry to reduce the viscosity and directly spraying the slurry onto the LEDs using a sprayer, which is one of fine-particle generators, or the like.

Patent Literature 1 proposed by the present applicant discloses an LED production method including coating heated LED chips with a slurry that includes a phosphor, a binder, and a solvent and that is atomized by a compressed air, using a pulsed spray stream so as to form multilayer thin films while causing the slurry to adhere to also the sidewalls of the LEDs, which are believed to be difficult to coat using a typical spray method.

Patent Literature 2 proposes a layer forming method including coating LED chips with a binder such as silicone, curing the binder, coating the coated LED chips with a slurry containing a phosphor, a binder, and a solvent, and optionally mixing a dispersing agent or the like with these components.

A method using a dispenser as disclosed in Non-Patent Literature 1 and the like includes filling the above slurry to bullet LEDs, which do not produce high power, or chips inserted into the inside of a cup, such as backlight LEDs. This method is often used for mass production.

The method of Patent Literature 1 can apply the slurry while making pulsed impacts and therefore can also coat the sidewalls of the LED chips. Also, the method applies the slurry so as to form multilayer thin films and therefore can adequately cover the edges of the LED chips and significantly increase the coating efficiency. However, the method applies the slurry even to areas between LED chips incorporated into an LED substrate formed of ceramic or the like, or coats areas which need not be coated while masking the areas, thereby reducing the use efficiency of the phosphor. Particularly, in the case of a substrate in which LED chips are distant from each other, the use efficiency of the phosphor is extremely low.

The method disclosed in Patent Literature 2 includes coating the LED chips with the binder, curing the binder, and then applying the slurry containing the phosphor to the binder using an air sprayer. However, it is knowledge common to the industry that this method using a common air sprayer results in an extremely poor coating efficiency.

On the other hand, a method involving applying a slurry containing a solvent-free binder formed of silicone or the like and a phosphor using a simple device, such as a dispenser, as disclosed in Non-Patent Literature 1 and the like does not require masking and achieves a high productivity. However, as shown in FIG. 7, the center of an LED chip is swelled, and the edges thereof are thinned, resulting in a poor vertical light color temperature distribution, as well as a poor spatial color temperature distribution. Such an LED is not suitable for a high-power illumination LED. Even if a slurry is filled, for example, using reflectors in place of dams, a thick film is formed. Accordingly, a light loss occurs due to diffuse reflection or the like, resulting in a loss of the phosphor efficiency.

CITATION LIST

Patent Literature

[Patent Literature 1] WO2011/083841A1
[Patent Literature 2] U.S. Pat. No. 8,058,088B2

Non-Patent Literature

[Non-Patent Literature 1] http://www.musashi-engineering.co.jp/case/case_033_00005.html
[Non-Patent Literature 2] http://www.tomitaeng.co.jp/

SUMMARY OF INVENTION

Technical Problem

On the other hand, if screen printing specialized in LEDs is used, a two-pack type curable silicone resin or the like is used as a binder. Such a binder cannot be used for a long time in terms of the pot life. Also, to stabilize coating quality, it is necessary to prepare a great amount of slurry. Consequently, a great amount of slurry that has passed the pot life is discarded, resulting in an extremely low use efficiency. While an electrophoresis method of U.S. Pat. No. 6,576,488B2 can form a phosphor film uniformly and is ideal, this method involves a complicated process and tends to be avoided in the industry. The industry has had a demand to uniformly form the thinnest possible phosphor film on LED chips to increase the use efficiency of the phosphor.

Solution to Problem

The present invention has been made to solve the above problems, and an object thereof is to provide an LED production method which allows for the production of LEDs with much higher performance than those produced by a typical production method and that allows for the use of a phosphor with high efficiency.

The present invention provides a method for producing LEDs. The method includes a first step of applying or filling a first slurry to multiple LEDs disposed on a substrate so as to form at least one layer, the first slurry containing at least a first phosphor and a binder whose weight ratio is 0.01:1 to 1:1, a second step of setting, on the substrate, a mask having openings corresponding to at least the LEDs after the first step, and a third step of applying or filling a slurry containing only a second phosphor and a solvent or a slurry containing a mixture and a solvent to the openings corresponding to the LEDs so as to form at least one layer, the mixture being a mixture of the second phosphor and a binder whose weight ratio is 1:0.01 to 1:0.5. The second phosphor or the mixture of the second phosphor and the binder adhering to the mask is recovered.

In the method for producing LEDs of the present invention, the substrate having the LEDs disposed thereon is a wafer-level LED or a ceramic-substrate LED. The method includes a first step of setting, on the substrate, a mask having openings corresponding to the LEDs, a second step of filling a first slurry containing a mixture of a first phosphor and a binder whose weight ratio is 0.01:1 to 1:1 to at least peripheries of the LEDs, and a third step of filling or applying a slurry containing a second phosphor and a solvent or a second slurry containing a mixture and a solvent to the LEDs so as to form at least one layer, the mixture being a mixture of the second phosphor and a binder whose weight ratio is 1:0.01 to 1:0.5. The second phosphor or the mixture of the second phosphor and the binder adhering to the mask is recovered.

The method for producing LEDs of the present invention includes a first step of setting, on the substrate, a first mask having openings corresponding to LEDs of a wafer-level LED or a ceramic-substrate LED, a second step of filling a first slurry containing a mixture of a first phosphor and a binder whose weight ratio is 0.01:1 to 1:1 to at least peripheries of the LEDs, and a third step of setting a second mask in place of the first mask or on the first mask, and a fourth step of applying a slurry containing a second phosphor and a solvent or a second slurry containing a mixture and a solvent so as to form at least one layer, the mixture being a mixture of the second phosphor and a binder whose weight ratio is 1:0.01 to 1:0.5. The second phosphor or the mixture of the second phosphor and the binder adhering to the second mask is recovered.

In the method for producing LEDs of the present invention, the slurry containing at least the second phosphor is preferably applied by spraying or using fine particles generated by a fine-particle generator.

In the method for producing LEDs of the present invention, preferably, the spraying is performed or the fine particles are used in a pulsed manner at a frequency of 5 to 200 Hz.

In the method for producing LEDs of the present invention, the first phosphor and the second phosphor are preferably of the same type.

In the method for producing LEDs of the present invention, the LEDs are preferably blue LEDs. The second phosphor is preferably phosphors of least two colors selected from four colors which are red, green, blue, and yellow, and the phosphors of the least two colors preferably form respective layers. The mask is preferably prepared so as to correspond to the at least two colors.

In the method for producing LEDs of the present invention, the LEDs are preferably near ultraviolet LEDs. The first phosphor is preferably a mixed color of phosphors of blue, green, and red. The second phosphor preferably forms layers of blue, green, and yellow. The mask is preferably prepared so as to correspond to types of respective phosphors.

In the method for producing LEDs of the present invention, the mask is preferably removed, and a binder is preferably applied to a layer of the slurry containing at least the second phosphor.

The present invention also provides LEDs produced using a slurry and the coating or filling method, the slurry being obtained by diluting, with a solvent, a recovered phosphor or a mixture of a phosphor and a binder.

According to the production method of the present invention, the layer formed of the mixture of the first phosphor and binder is binder-rich. Thus, any problem associated with the adhesiveness does not occur in lens molding, which is the final step.

By adding a solvent to the mixture of the first phosphor and binder serving as the first layer to increase fluidity, the slurry can be easily filled to a desired area. Thus, the slurry can be easily applied in a manner such as pulsed spraying.

In particular, a lead-frame LED has reflectors formed thereon. Accordingly, when a slurry is filled to a lead-frame LED, there is no need to form dams or to use a mask. Thus, productivity can be increased. If the level of the filled first slurry is set to within ±30 microns from the upper surfaces of LEDs and if the slurry containing the second phosphor or the phosphor-rich slurry is filled so as to form a thin film, not only performance but also productivity is drastically improved. Of course, this method can also be applied to a ceramic-substrate LED, chip-on-board (COB), and the like, and a phosphor can be filled by forming dams in desired areas or setting, on the substrate, a mask having openings corresponding to desired areas. In the case of COB, the following method can be applied: the slurry containing the first phosphor is filled; the curing of the binder is facilitated; then a mask corresponding to individual LEDs is set; and the slurry containing the second phosphor is filled or applied.

The slurry may be filled by potting, or may be filled by reducing the air pressure and flow rate of an air sprayer or air-assist sprayer. The slurry may be filled in a pulsed manner. The air pressure may be, for example, 5 to 100 KPa, and the flow rate may be, for example, 1 to 20 NL/min. Thus, the slurry adheres in the form of coarse particles and therefore the splash thereof can be reduced.

To apply the slurry by spraying without causing the phosphor to adhere to the reflectors, a three-dimensional mask that covers the reflectors should be placed. The slurry containing the second phosphor may be transferred onto the first slurry-filled layer or coating layer by making impacts on pulsed spraying or placing the slurry on a jet stream. Thus, the phosphor can be caused to adhere to the binder-rich layer so as to sink thereinto.

In the present invention, the solvent or dispersing medium in which the phosphor is dispersed when preparing the slurry may be a mild, alcohol-based solvent such as ethanol, water, a mixture thereof, a liquefied gas such as carbon dioxide gas, or the like. If layers are formed on the phosphor layer containing the binder, such as silicone, using these methods, it is preferred to volatilize 95% or more of the solvent and to apply the resulting powdery solvent, since the solvent or dispersing medium is less soluble to silicone.

Advantageous Effects of Invention

As described above, according to the present invention, for example, when the phosphor-containing slurry containing the first phosphor and binder is filled to the peripheries of LEDs, it is preferable that the amount of the phosphor be an amount such that light exiting the sidewalls can be converted into a desired color temperature. If the slurry is filled to nearly the upper surfaces of the LEDs or slightly covers the upper surfaces, the edges of the LEDs need not be covered. When the LEDs are filled and covered with the slurry, it is preferred to previously improve the wettability of the LED surfaces by flame, corona, plasma processing, or the like.

By using these methods, it is possible to obtain the same effect as that of pulsed spraying which makes impacts, as well as to easily recover the expensive phosphor. Thus, high-value-added, high-quality LEDs can be produced at low cost.

DETAILED DESCRIPTION

Now, a preferred embodiment of the present invention will be described with reference to the drawings. However, the embodiment below is only an example for facilitating the understanding of the present invention. Addition, replacement, deformation, or the like executable by those skilled in the art can be made thereto without departing from the technical idea of the present invention.

The drawings schematically show the preferred embodiment of the present invention.

Figure 1:
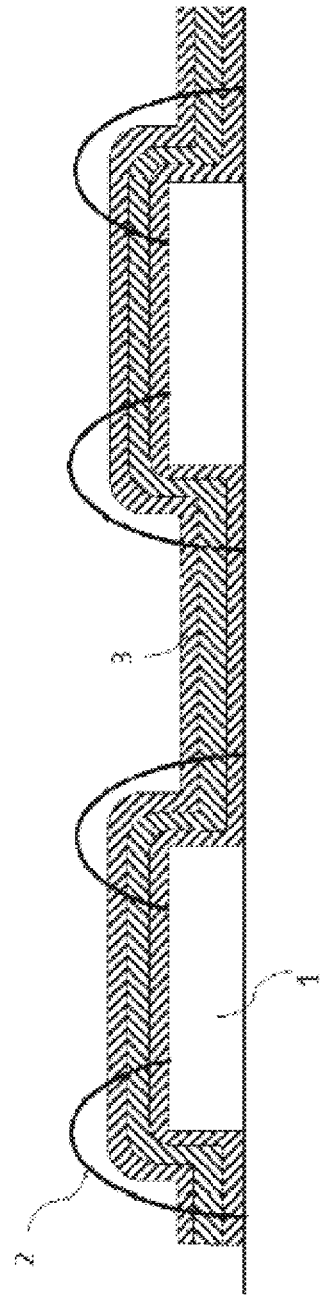
FIG. 1 is a schematic sectional view showing a conventional special spray coating method.

In FIG. 1, a slurry is applied to LEDs so as to form multilayer thin films while making impacts on a pulsed spray stream. More specifically, this process is performed using a method or apparatus of Japanese Patent Application No. 2011-200395 whose right the present applicant has. Thus, it is possible to coat also the side surfaces of the LEDs, to achieve a coating efficiency of 95% or more, and to form a favorable coating. However, even areas which need not be coated are coated, thereby significantly reducing the use efficiency of the phosphor. If the LEDs are arranged with a wide pitch on the substrate, the actual use efficiency of the phosphor may fall below 5%.

Also, increasing performance requires forming thin films and making the proportion of the phosphor higher than that of the binder. If the proportion of the phosphor is too high, when lens molding of the resin is performed, the adhesiveness to the substrate is reduced. For this reason, typically, it is necessary to leave a part not coated by masking.

In first modifications of the embodiment of the present invention shown in FIG. 2 and later, elements corresponding to the LEDs and the like shown in FIG. 1 are represented by reference signs obtained by sequentially adding 10, 20, 30, 40, 50, and 60 to the reference signs shown in FIG. 1. The differences between FIG. 1 and the other drawings will be mainly described below.

Figure 2:
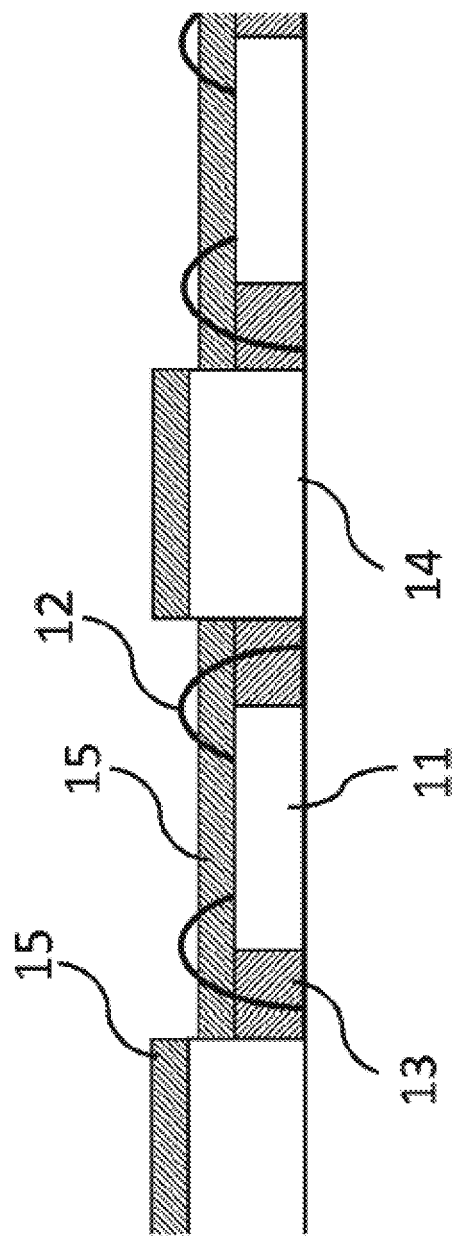
FIG. 2 is a schematic sectional view showing an embodiment of the present invention.

In FIG. 2, a mask 14 is set so as not to interfere with LED chips 11 or wires 12. Then, a binder-rich slurry is filled or applied from the openings of the mask. Optionally, the curing of the binder is facilitated and then a slurry containing a second phosphor is filled or applied onto the slurry. Preferably, the binder or a mixture of a first phosphor and a binder is diluted with a soluble solvent so that the filling or the like of the binder or mixture is facilitated and air bubbles are not easily mixed thereinto.

If a filling method is used, it is preferred to previously surface-treat the LEDs using plasma or the like to improve the wettability of the LEDs. More preferably, a solvent is previously applied to the areas to which the slurry is to be filled. To apply the phosphor more uniformly, it is important to fill or apply any of the slurry containing the first phosphor and the slurry containing the second phosphor in divided amounts multiple times. If the slurry containing the first phosphor is filled, the level of the filled and then dried/cured slurry preferably falls within ±30 micrometers from the heights of the LEDs. Thus, it is possible to cover the edges adequately, to reduce the total film thickness, and to easily adjust the spatial color temperature.

To prevent the sedimentation of the filled phosphor, the substrate should be heated. It is preferred to facilitate the curing of the binder each time the mixture or slurry is filled or applied. To sediment the filled or applied phosphor, a slurry containing a solvent may be used to reduce the viscosity.

Figure 3:
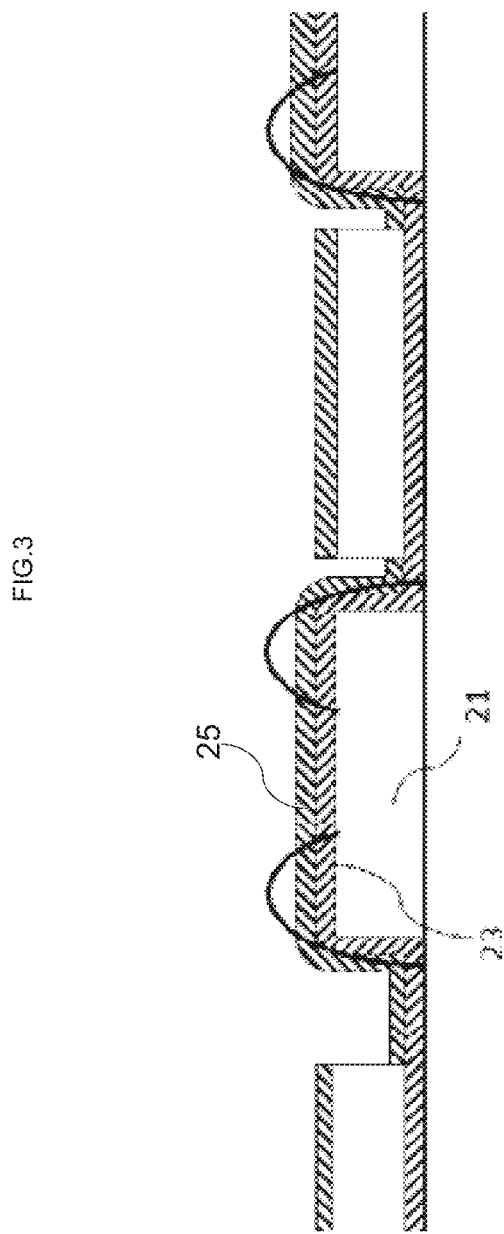
FIG. 3 is a schematic sectional view showing the embodiment of the present invention.

In FIG. 3, LEDs, a substrate including the LEDs, or the like are coated with a mixture of a binder and a first phosphor. A solvent or dispersing agent may be added to the mixture. While any type of coater may be used, it is preferred to use a pulsed sprayer that makes impacts. If the entire substrate is coated, the content of the phosphor is preferably 50% or less by weight, ideally 3 to 30% or less by weight considering the adhesiveness of a lens mold resin in the aftertreatment. The reason is that the presence of a phosphor improves thixotropic properties and makes dripping on the sidewalls less likely to occur or the edges sink mark less likely to occur compared to the use of the binder alone. The content of the phosphor should be determined on the basis of the amount of light emitted from the side surfaces of the LEDs and color conversion per unit volume. When a mask is set, it is preferred to facilitate the drying or curing of the binder so as to be almost dry to touch.

If the slurry containing the second phosphor and binder is filled, it is preferred to cause the mask to adhere to the substrate. On the other hand, if a binder whose curing is facilitated at low temperature is used and if spray coating is performed, it is preferred to float the mask slightly above the substrate in terms of recovery. This is because the curing of the binder on the mask is slowed down. Typically, when filing or applying a phosphor to an LED, an LED conducts heat by adsorbing heat using an adsorption heating table. For this reason, it is preferred, for example, to use a heat insulating mask or to reduce the adsorbability to the mask. After filling or applying the slurry, it is preferred to remove the mask quickly, to cause the LEDs to adsorb the substrate, and to facilitate the curing of the binder quickly using a table heated to 50 to 120° C., a far infrared heater, or the like.

Figure 4:
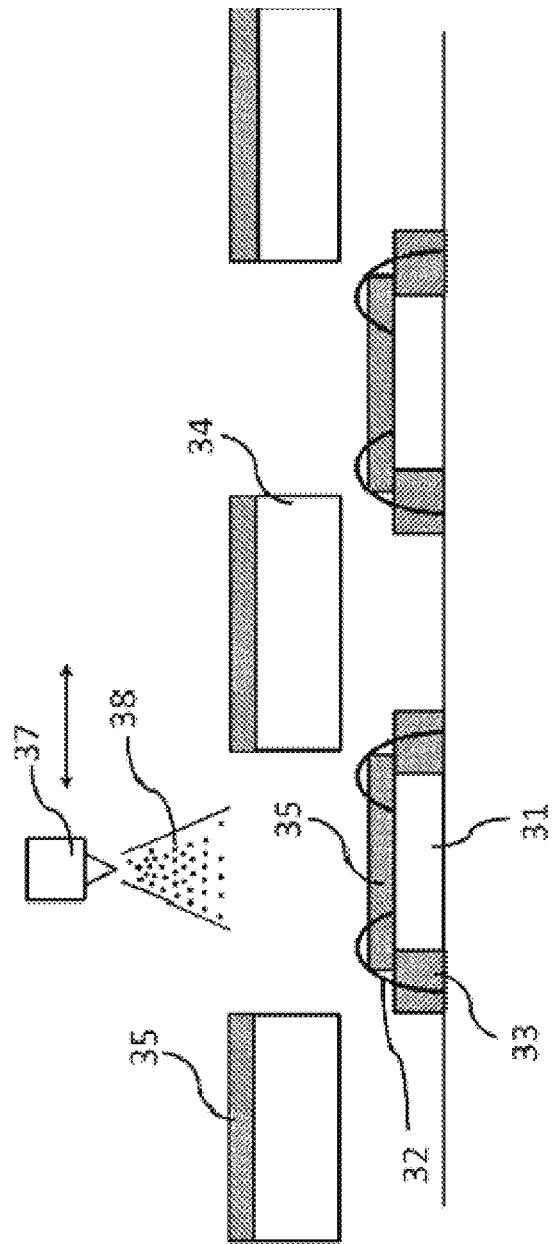
FIG. 4 is a schematic sectional view showing the embodiment of the present invention.

In FIG. 4, a second slurry is spray-applied to the peripheries of LEDs 31 or, optionally, at least part of a coating layer of a slurry containing a first phosphor filled to up to the upper portions of the LEDs and the upper portions of the LEDs using a coater. Thus, phosphor layers 35 are formed. The phosphor can be dispersed more uniformly by spraying the slurry so as to form 3 to 15 thin film layers while traversing the coater. Thus, the performance of the LEDs is improved. In order for the LEDs to show an ideal color temperature distribution, a mask 34 is set above the LEDs. The openings of the mask and the coating areas should be determined on the basis of the structure of the LED, the proportion of the phosphor in the peripheries or upper portions of the LEDs, or the like. Except in flip-chip LEDs, the mask can be easily handled by setting it in a higher position than wires 32, allowing for automation.

Figure 5:
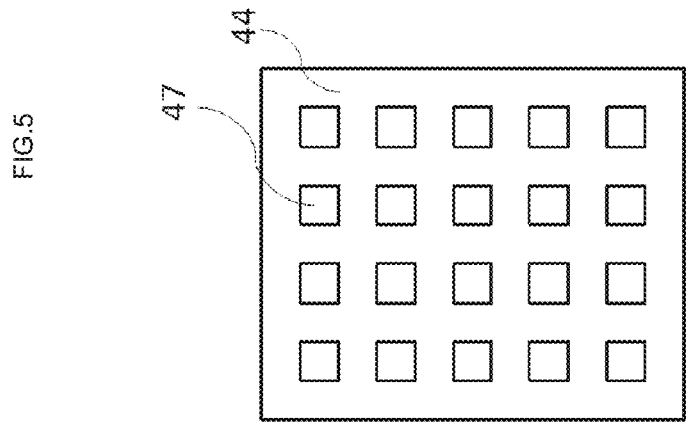
FIG. 5 shows a mask according to the embodiment of the present invention.

In FIG. 5, a mask 44 has openings for preventing the interference of an LED chip or wire.

Figure 6:
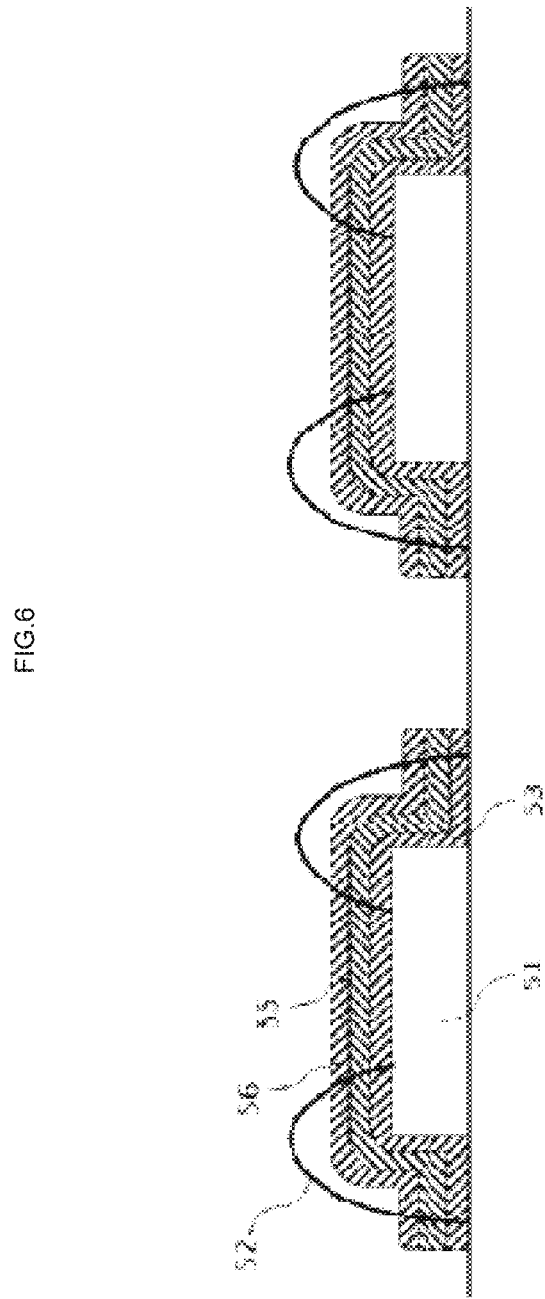
FIG. 6 is a schematic sectional view of LEDs obtained by the present invention.

FIG. 6 shows a coating formed according to the present invention. A slurry layer 53 containing a binder and a first phosphor preferably consists of multiple layers. Similarly, a slurry layer 55 containing a second phosphor preferably consists of multiple layers. After applying the slurry which is substantially binder-free and contains the second phosphor alone, a thin-film cover coat layer 56 containing a binder alone may be formed to prevent the phosphor from leaving the layer due to vibration or the like. Of course, the entire substrate may be coated with a coating of, for example, 5 micrometers or less.

Figure 7:
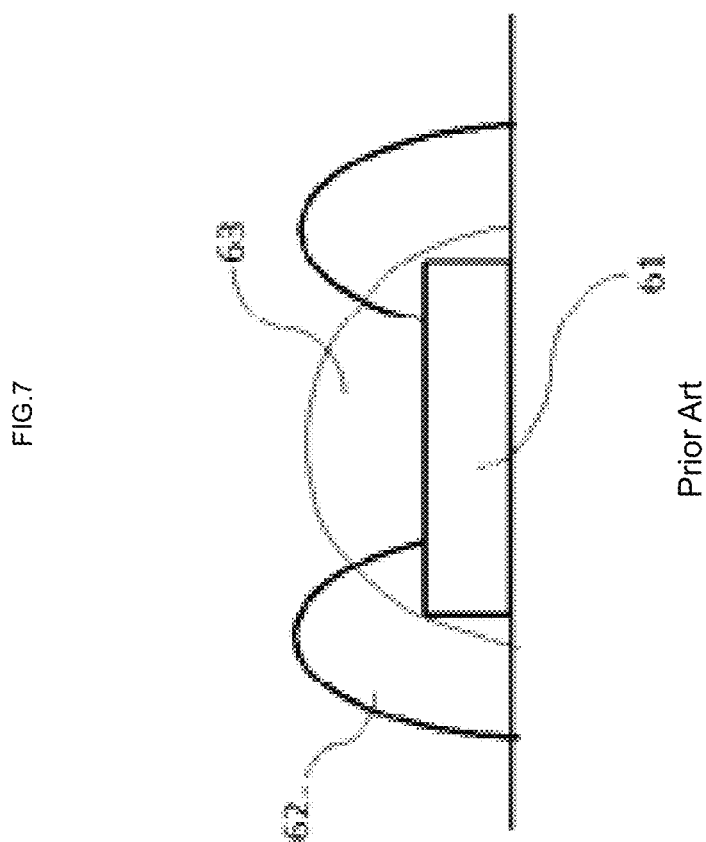
FIG. 7 is a schematic sectional view showing a conventional dispensing method.

FIG. 7 is a schematic diagram showing an LED 61 coated with a phosphor-containing slurry applied using a conventional dispenser or the like. A slurry layer 63 has a thick central portion and fails to cover the edges of the LED 61, resulting in variations in the color temperature. Also, if the amount of coating is small, areas around pads to which leads 62 are joined are shadowed and are less likely to be coated.

Figure 8:
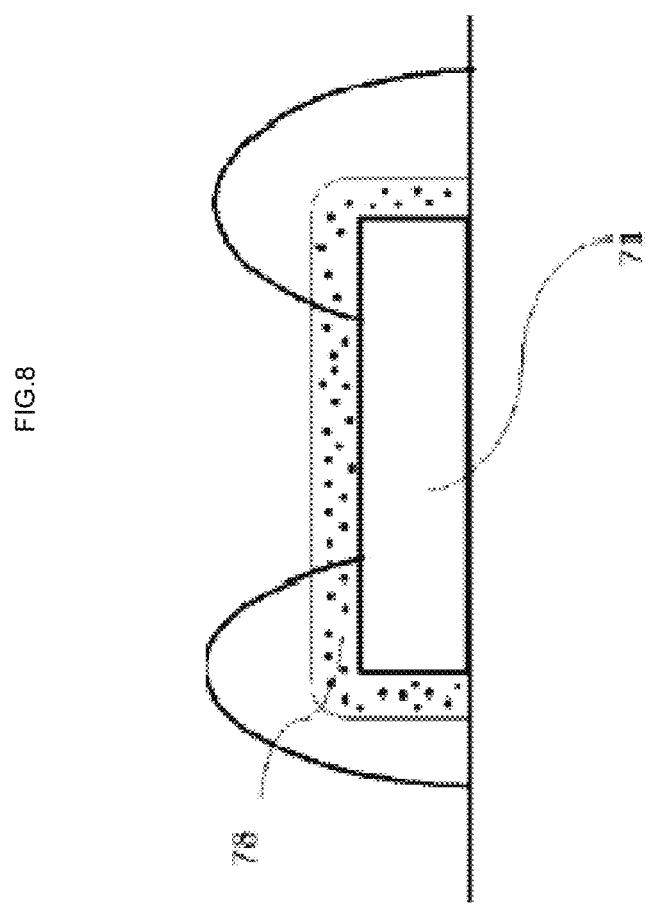
FIG. 8 is a schematic sectional view showing the embodiment of the present invention.
Figure 9:
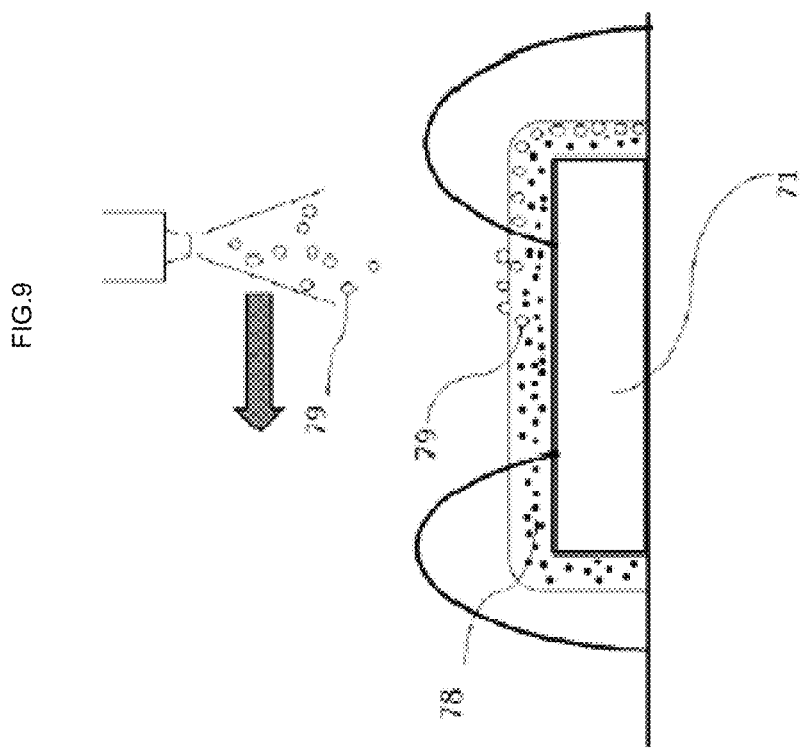
FIG. 9 is a schematic sectional view showing the embodiment of the present invention.

FIG. 8 shows a binder-rich layer containing a first phosphor 78. FIG. 9 shows images in which particles 79 containing a second phosphor or containing a second phosphor and a binder sink into the binder-rich layer while colliding with each other in a spray stream or jet stream.

For the conventional art, it is extremely difficult to form a thin film by only once applying, for example, a slurry containing a high-specific-gravity phosphor whose particle sizes are averagely around 8 micrometers and are distributed in a range of 1 micrometer or less to 30 micrometers, a binder having a relatively low specific gravity, and optionally a solvent with variations of ±1.5% per unit area. The reason is that there are, of course, large particles and small particles when observed microscopically.

The method of the present invention applies the technology of Japanese Patent Application No. 2011-200395 and can apply the first binder, the slurry, or the slurry containing the second phosphor while favorably dispersing the first binder or the like. A coater may be disposed between two syringes, and slurries in the two syringes may be moved using the differential pressure while being stirred using stirrers. In particular, the present invention has advantages in preventing the sedimentation of a slurry containing only a phosphor and a solvent, a slurry that contains a phosphor, a binder, and a solvent and whose phosphor-binder weight ratio is 1:0.5 to 1:0.01, or a slurry containing multiple types of phosphors and a solvent, as well as in stably dispersing these slurries. Since this method can prevent the sedimentation, it can advantageously reduce the differential pressure and also reduce the amount of coating per unit time. If the syringe volume is increased, for example, to 150 ml or more, multiple impellers may be mounted so that upward and downward stirring streams can be generated.

By stacking five or more thin films according to the present invention, a uniform coating film can be formed in terms of the probability even if a phosphor having a poor particle size distribution is used. Also, by applying vibration such as ultrasound to a preferred area of the circulation circuit, a more favorable dispersion state can be maintained. In preferred coating formation, conductivity may be given to the surfaces of the LEDs as in electrophoresis. Thus, by filling atomized particles using static electricity or the like, for example, in spray coating, it is possible to prevent the coagulation of the atomized particles owing to electrostatic repulsion and to cause the fine particles to adhere. As a result, ideal phosphor coating can be performed, and ideal LEDs can be produced.

The present invention is not limited to applying one type of slurry using a single coater so as to form multiple layers. Multiple types of phosphors may be applied using multiple coaters so as to form multiple layers. Specifically, LEDs may be produced by stacking layers of different types of phosphors on LEDs using a coating apparatus in which multiple coaters are disposed in multiple coating booths and drying the phosphor layers, or in a single coating booths and drying the phosphor layers. The at least two types of phosphors may be selected from at least red, green, yellow, and blue phosphors.

If the slurry containing at least the second phosphor is substantially binder-free or contains the smallest possible amount of binder, it is possible to recover the phosphor, which is preferable in view of reuse of the phosphor.

The mask may have any size or shape or may be formed of any material as long as the phosphor is recovered favorably. However, to recover and reuse the phosphor while maintaining the high performance thereof, it is ideal that the mask be formed of a ceramic-based material, which is less likely to be abraded by phosphor. As the surface is finished better, it is possible to remove the mixed binder, if any, using an ultrasonic washer or the like and to recover the phosphor in a shorter time.

In terms of contamination, the mask is preferably made of the same material as that used as the surfaces of the LEDs or the phosphor, or coated with an inorganic material such as ceramic or metal which does not affect the LEDs. For high-speed production, a heat-resistant, solvent-resistant plastic film having a heat-resistant, solvent-resistant adhesive applied to the back surface thereof may be previously laminated to an LED substrate. The heat-resistant, solvent-resistant plastic film is typified by a fluororesin or polyimide amide resin. Examples of the heat-resistant, solvent-resistant adhesive include silicone-based, crosslinked and acrylic-based, and urethane-based adhesives.

If the coater is an air spray or air-assist spray or if, in particular, the slurry containing the second phosphor is formed into particles using a particle producer and then the phosphor particles are carried using a jet stream, the pattern width of the particles on the LED substrate is preferably on the order of 1 to 20 mm. The pattern width should be selected considering the thicknesses of the desired areas of the entire chip on the basis of the shape or type of the chip.

Considering the facilitation of the flow characteristics or the curing of the binder, for example, when spraying a slurry, or a temperature reduction caused by the heat of vaporization that occurs when forming a coating, for example, by spraying a slurry, or the like, the following method is preferred: the method includes heating LEDs to 30 to 120° C.; setting the distance between the LEDs and the spray head to 5 to 90 mm; setting, to 1 to 20 mm, the spray pattern width when reaching the LED; ejecting the slurry at a spray air pressure of 0.1 to 0.4 MPa in a pulsed manner; and spraying the slurry while making impacts in a pulsed manner.

Whether a single color or multiple colors, it is preferred to apply or fill the slurry, in particular, the slurry containing the second phosphor while automatically measuring and checking the weight of each coating layer or each desired coating layer. In particular, it is important to obtain desired quality while measuring the color temperature in the layer immediately preceding the last layer and optionally correcting the amount of coating.

INDUSTRIAL APPLICABILITY

According to the present invention, an expensive phosphor is recovered and reused while maintaining the high quality of particularly high value-added LEDs. Thus, the phosphor can be used 10 times or more as efficiently as in the conventional process. As a result, the cost can be significantly reduced.

DESCRIPTION OF REFERENCE SIGNS 1, 11, 21, 31, 41, 51, 61, 71 LED
2, 12, 22, 32, 42, 52, 62 wire
3, 63 phosphor layer
13, 23, 33, 43, 53 first phosphor layer
14, 34, 44 mask
15, 25, 35, 55 second phosphor layer
56 binder (cover layer)
78 first phosphor
79 second phosphor
37 coater
38 second slurry
47 opening

The invention claimed is:

1. A method for producing LEDs, the LEDs being LEDs obtained by coating LED chips on an LED substrate with a phosphor, the method comprising:
a first step of forming a mask having openings and adhered to the LED substrate for filling a binder-rich first slurry containing at least a phosphor and a binder to at least peripheries of the LED chips;
a second step of filling the first slurry to at least the peripheries of the LED chips in such a manner that a level of the filled first slurry falls within a range of ±30 micrometers from heights of the LED chips; and
a third step of filling or applying a phosphor-rich second slurry containing at least a phosphor and a binder onto at least the LED chips.

2. The method for producing LEDs of claim 1, wherein the LEDs are lead frame LEDs where reflectors serving the mask is formed on the peripheries of the LED chips, and
the second slurry further comprises a solvent.

3. The method for producing LEDs of claim 1, wherein the LEDs are chip-on-board (COB) LEDs, the method further comprising
a fourth step of facilitating curing of the binder of the first slurry.

4. The method for producing LEDs of claim 1, wherein the second slurry contains at least a solvent and is filled or applied in divided amounts a plurality of times.

5. The method for producing LEDs of claim 4, wherein after the second step or each time the first slurry is filled in the second step, or each time the second slurry is filled or applied in the third step, curing of the binder is facilitated.

6. The method for producing LEDs of claim 2, wherein a level of the first slurry filled in the second step and then dried is approximately equal to heights of the LED chips.

7. The method for producing LEDs of claim 1, wherein the second slurry has a plurality of particles,
each particles has one or more phosphors selected from red phosphor, yellow phosphor, green phosphor, and blue phosphor, and
the plurality of particles are filled or applied using different coaters so as to form a plurality of layers.

8. LEDs obtained by a manufactured method comprising:
a first step of causing a first mask having openings corresponding to LED chips on an LED substrate to adhere to the LED substrate;
a second step of filling a binder-rich first slurry containing at least a phosphor and a binder to at least peripheries of the LED chips in such a manner that a level of the filled first slurry falls within a range of ±30 micrometers from heights of the LED chips; and
a third step of filling or applying a phosphor-rich second slurry containing at least a phosphor, a binder, and a solvent to at least the LED chips a plurality of times.

9. The LEDs obtained by a manufactured method of claim 8, wherein
the LEDs are lead-frame LEDs,
the manufactured method further comprises a fourth step of covering reflectors with a three-dimensional mask so that the reflectors are prevented from being contaminated by the second slurry filled or applied by spraying, and
the third step is performed by spraying.

10. LEDs that are chip-on-board (COB) LEDs, obtained by a manufactured method comprising:
a first step of filling a binder-rich first slurry containing at least a phosphor and a binder to at least peripheries of LED chips in such a manner that a level of the filled first slurry falls within a range of ±30 micrometers from heights of the LED chips;
a second step of facilitating curing of the binder of the first slurry; and
a third step of filling or applying a phosphor-rich second slurry containing at least a phosphor, a binder, and a solvent to at least the LED chips.

* * * * *